(12) United States Patent
Shih

(10) Patent No.: US 8,093,153 B2
(45) Date of Patent: Jan. 10, 2012

(54) METHOD OF ETCHING OXIDE LAYER AND NITRIDE LAYER

(75) Inventor: Ping-Chia Shih, Hsinchu (TW)

(73) Assignee: United Microelectronics Corporation, Hsinchu (TW)

( * ) Notice: Subject to any disclaimer, the term of this patent is extended or adjusted under 35 U.S.C. 154(b) by 231 days.

(21) Appl. No.: 12/641,323

(22) Filed: Dec. 18, 2009

(65) Prior Publication Data

US 2011/0151672 A1 Jun. 23, 2011

(51) Int. Cl.
*H01L 21/306* (2006.01)
*H01L 21/314* (2006.01)

(52) U.S. Cl. ........ 438/703; 438/443; 438/717; 438/736; 257/E21.219; 257/E21.267

(58) Field of Classification Search .................. 438/443, 438/703, 717, 736; 257/E21.267
See application file for complete search history.

(56) References Cited

U.S. PATENT DOCUMENTS

| 7,282,434 | B2* | 10/2007 | Tamaru et al. | 438/618 |
| 2002/0182881 | A1* | 12/2002 | Ni et al. | 438/725 |
| 2003/0129840 | A1* | 7/2003 | Kumar et al. | 438/694 |
| 2008/0160774 | A1* | 7/2008 | Kim et al. | 438/703 |
| 2009/0163029 | A1* | 6/2009 | Tsutsumi et al. | 438/703 |
| 2010/0041235 | A1* | 2/2010 | Hashimoto et al. | 438/703 |

* cited by examiner

*Primary Examiner* — Angel Roman
(74) *Attorney, Agent, or Firm* — Chun-Ming Shih

(57) ABSTRACT

An exemplary method of patterning oxide layer and removing residual nitride includes steps of forming a first oxide layer, a nitride layer, a second oxide layer and a complex hard mask on a substrate in turn. The first oxide layer covers an insulating structure. The second oxide layer, the complex hard mask and the nitride layer are etched by utilizing a patterned photoresist as an etching mask, so as to expose the first oxide layer. In addition, the part of the nitride layer covering the insulating structure can be further removed. Accordingly, the present invention can effectively control layout patterns of material layers and doped regions and thereby can improve the performance of a narrow width device.

15 Claims, 7 Drawing Sheets

METHOD OF ETCHING OXIDE LAYER AND NITRIDE LAYER

BACKGROUND

1. Technical Field

The present invention generally relates to a method of etching an oxide layer and a nitride layer, and more particularly to a method of forming an oxide-nitride-oxide (ONO) structure.

2. Description of the Related Art

Usually, there are many applications of nitride and oxide within integrated circuits (ICs), for example, an isolation structure between adjacent transistors, a gate spacer, an etch stop layer, a protection layer for outermost layer of IC chip, an ONO structure, etc.

A non-volatile static random access memory (nvSRAM) is taken as an example. The nvSRAM generally includes a static random access unit and a non-volatile memory unit. The static random access unit is applied for temporarily accessing data when a power is supplied. The non-volatile memory unit is capable of storing data even when the power supply to it is cut off. The nvSRAM uses a silicon-oxide-nitride-oxide-silicon (SONOS) structure formed therein as a memory cell. During the operation of the nvSRAM, data signals (e.g., digital signals "0" and "1") implement action such as write (programming), erase or read in the SONOS structure.

However, during fabrication process of the SONOS structure, it is found that sidewalls of a shallow trench isolation (STI) structure that protrude out of a surface of wafer usually have unwanted residual material layer forming a redundant fence (termed as sidewall residual or redundant spacer). Such redundant fence would change a surface profile of the STI structure and increase a width of the STI structure. Moreover, the redundant fence would serve a mask of subsequent etching processes and implantation processes. The influence caused by the redundant fence can not be eliminated by adjusting the position of the implantation mask or the direction of the implantation process. As a result, the area of doped regions and the etching window are decreased. In other words, the redundant fence would cause reduction in the effective area of active region, especially for a narrow width device. Even more, the redundant fence would cause decrease in current of the narrow width device and thus adversely influence the operation of the narrow width device.

If a process time of the etching process is prolonged, an additional isotropic etching process is required, or an additional anisotropic etching process is required in order to remove the redundant fence, which may seriously damage the other material layers or components on the surface of wafer. For example, a serious side effect may therefore damage the SONOS structure. The fabrication and operation of the device may be worse due to such an additional etching process.

BRIEF SUMMARY

Accordingly, the present invention is directed to a method of etching an oxide layer and a nitride layer, to effectively remove a redundant fence on a surface of wafer and thereby the above-mentioned problems of the prior art may be resolved.

In one embodiment, a method of etching an oxide layer and a nitride layer is provided. First, a substrate having an insulating structure is formed is provided. Subsequently, a first oxide layer is formed on the substrate, and covers the insulating structure. Afterwards, a nitride layer is formed on the first oxide layer, a second oxide layer is formed on the nitride layer, and a complex hard mask is formed on the second oxide layer. Next, portions of the complex hard mask, the second oxide layer and the nitride layer are etched by using a patterned photoresist as an etching mask to expose the surface of the first oxide layer.

In one embodiment, the portion of the nitride layer covers sidewalls of the insulating structure, and the step of etching the nitride layer includes using a phosphoric acid solution to remove the portion of the nitride layer covering the insulating structure.

Since the present invention uses the complex hard mask including nitride layer and oxide layer, the redundant fence may be effectively removed due to different etching selectivity of the nitride layer and the oxide layer. Therefore, layout patterns of the active device may be more accurately controlled and the performance of the active device may be effectively improved.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Hereinafter, an embodiment of the present invention will be described in detail with reference to the accompanying drawings. Here, it is to be noted that the present invention is not limited thereto. Furthermore, the step serial numbers concerning the saturation adjustment method are not meant thereto limit the operating sequence, and any rearrangement of the operating sequence for achieving same functionality is still within the spirit and scope of the invention.

Figure 1:
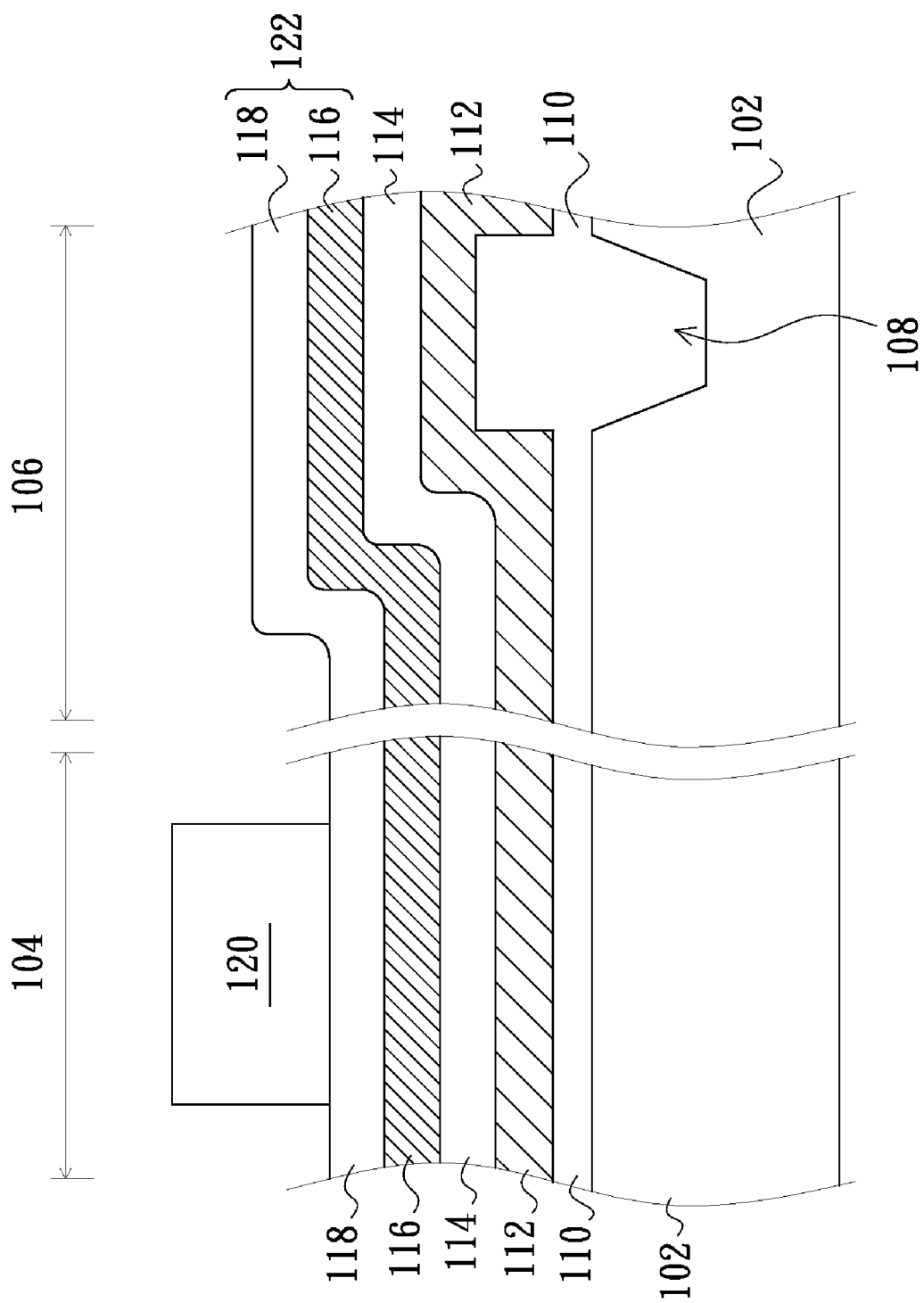
FIGS. 1 through 7 are schematic views associated with a method of etching an oxide layer and a nitride layer in accordance with an embodiment of the present invention.

Referring to FIGS. 1 through 7, FIGS. 1-7 illustrate schematic views associated with a method of etching an oxide layer and a nitride layer in accordance with an embodiment of the present invention. In the drawings, same or like components or parts are designated by the same reference numerals. It is to be understood that the drawings are not drawn to scale and are served only for illustration purposes. As illustrated in FIG. 1, a substrate 102, for example, comprised of a silicon substrate, a silicon-containing substrate or a silicon-on-insulator (SOI) substrate, etc. is first provided. The substrate 102 has at least one active region 104 and at least one isolation region 106 defined thereon. The active region 104 is used for the forming various active devices, for example, an ONO structure, an SONOS transistor or other logic devices. The isolation region 106 may have an isolation structure 108, for example, a shallow trench isolation (STI) structure or a field oxide layer formed therein by a STI process or a local oxidation (LOCOS) process. The isolation structure 108 may surround and isolate the active devices in the active region 104.

The topography of the substrate 102 may have an undulated profile along with various layout patterns and thus is not a planar surface. For example, in the illustrated embodiment, the isolation structure 108 is an insulating structure on the top surface of the substrate 102, which steps high from the top surface of the substrate 102. The isolation structure 108 may be higher than the substrate 102 located two sides thereof, say about 300 angstroms.

Subsequently, a bottom oxide layer 110 is formed over the entire top surface the substrate 102 covering the substrate 102 by performing, for example, a thermal oxidation process, a chemical vapor deposition (CVD) process, or a plasma enhanced chemical vapor deposition (PECVD) process.

Advantageously, the bottom oxide layer 110 formed by the thermal oxidation process would have favorable anti-corrosion effect, but however, the present invention is not limited to this example as such.

Next, a nitride layer 112 is blanket deposited over the bottom oxide layer 110, a top oxide layer 114 is blanket deposited over the nitride layer 112, a nitride mask layer 116 is blanket deposited over the top oxide layer 114, an oxide mask layer 118 is blanket deposited over the nitride mask layer 116 and a patterned photo-resist 120 is formed over the oxide mask layer 118. The nitride mask layer 116 and the oxide mask layer 118 may form a complex hard mask 122. The nitride layer 112, the top oxide layer 114, the nitride mask layer 116 and the oxide mask layer 118 all, for example, may be formed by performing CVD or PECVD process. The patterned photo-resist 120. For example, may be formed by a coating process and a lithography process. The patterned photo-resist 120 herein can be disposed in the active region 104 and for defining the position of subsequent ONO structure. A portion of the nitride layer 112 covers a surface of the isolation structure 108 (i.e., insulating structure).

A thickness of the top oxide layer 114 is preferably larger than or equal to 50 angstroms, so that the top oxide layer 114 still has enough structural thickness even after exposure to the subsequent etching process, which may improve the performance of subsequently formed ONO structure. The patterned photo-resist 120 advantageously may include a deep ultraviolet (DUV) photo-resist material, but not limited to this example. The DUV photo-resist material may provide a favorable etching mask effect, so that a better layout pattern can be formed during etching the oxide mask layer 118 and the nitride mask layer 116. Thus, a subsequent patterning step may also provide a better control on a layout pattern. As a result, a critical dimension of layout pattern may be further decreased, and better device accuracy may be achieved.

Figure 2:
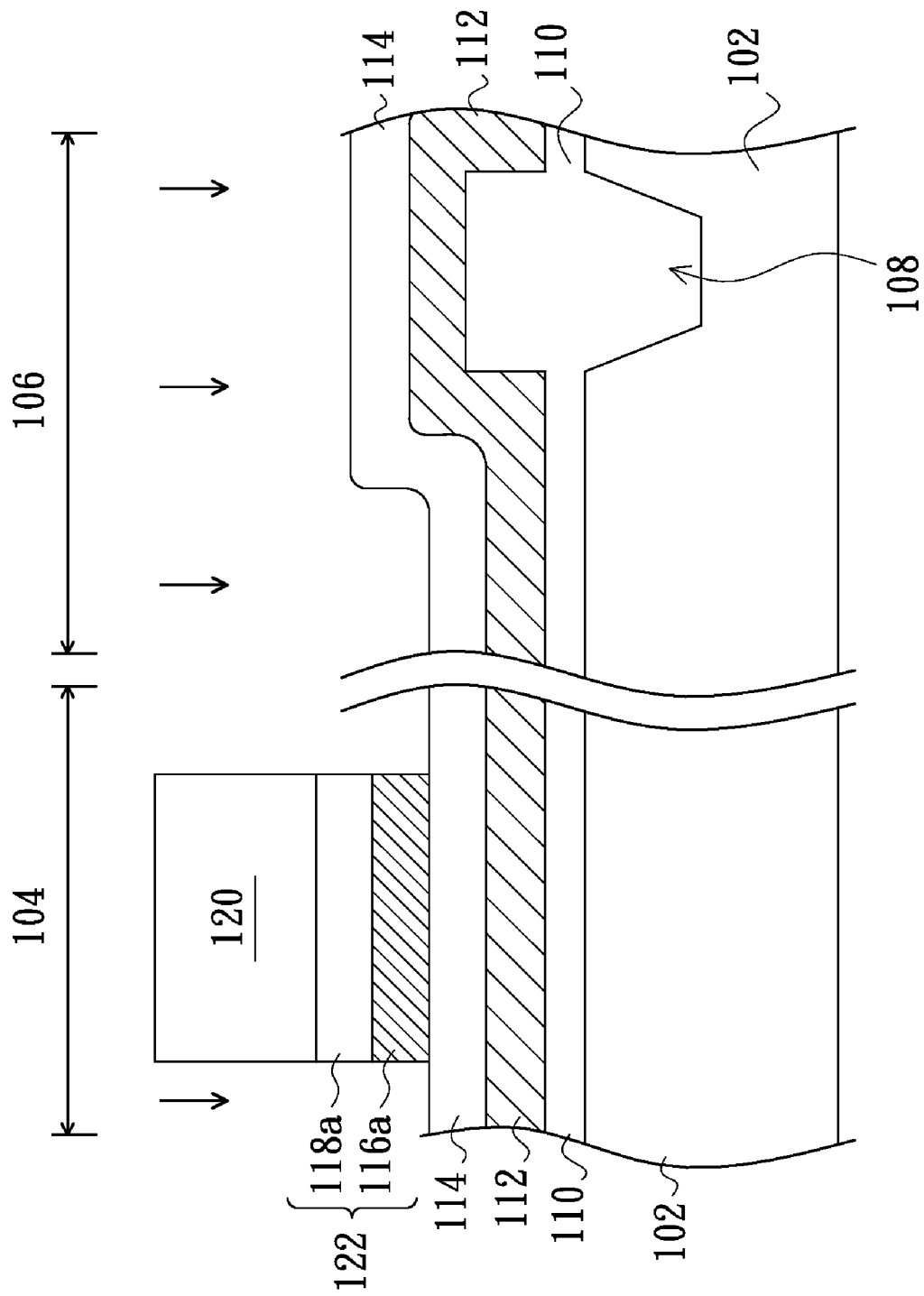
Figure 3:
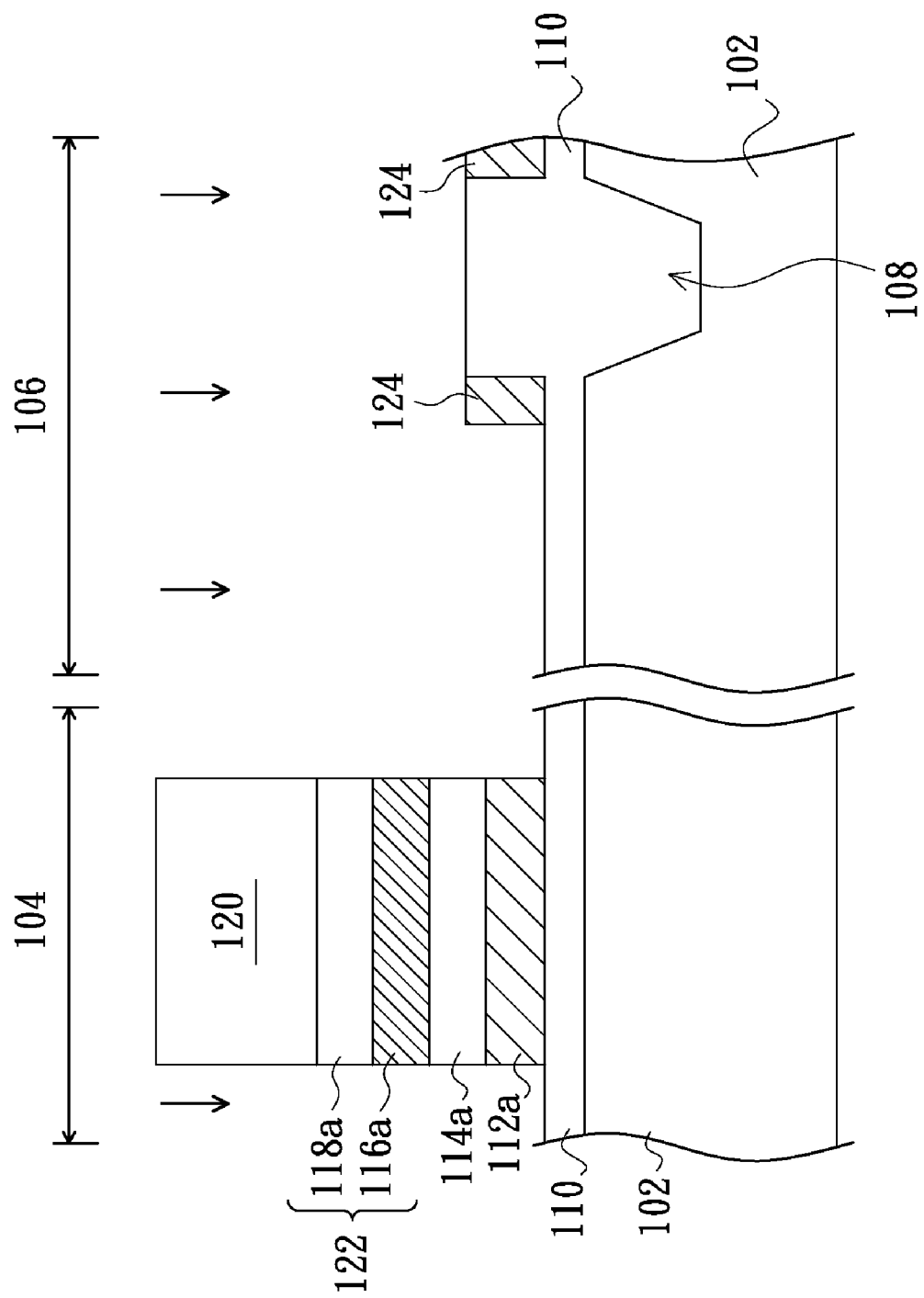

Referring to FIG. 2 and FIG. 3, the patterned photo-resist 120 is used as an etching mask, and an anisotropic etching process may be performed to etch the oxide mask layer 118, the nitride mask layer 116, the top oxide layer 114 and the nitride layer 112 until the bottom oxide layer 110 is exposed, to form a patterned nitride hard mask 116a, a patterned oxide hard mask 118a, a patterned top oxide layer 114a and a patterned nitride layer 112a. The patterned nitride hard mask 116a is disposed on the top oxide layer 114, and the oxide hard mask 118a is disposed on the nitride hard mask 116a.

Because of the insulating structure, a portion of the nitride layer 112 easily remains around the protruded isolation structure 108 as a redundant fence 124 (or termed as spacer) after the above-mentioned anisotropic etching process. Especially when the insulating structure has a high step profile, the fence 124 may more easily reside at the sidewalls of the insulating structure. It is found from the formation principle of the redundant fence 124, the redundant fence 124 is not limited to be formed from the nitride layer 112. In other embodiments, the fence 124 may include other material layer or be formed by other nitride layer.

Due to the complex hard mask 122, the patterning of the top oxide layer 114 can be much better controlled than the method of using the pattern photo-resist 120 as an etching mask directly contacting the top oxide layer 114. For example, such etching process of using the nitride hard mask 116a can reduce the undercut effect of the top oxide layer 114a, so that the sidewall loss of the top oxide layer 114a can be reduced to less than 0.1 micrometers and even less than 0.025 micrometers.

Figure 4:
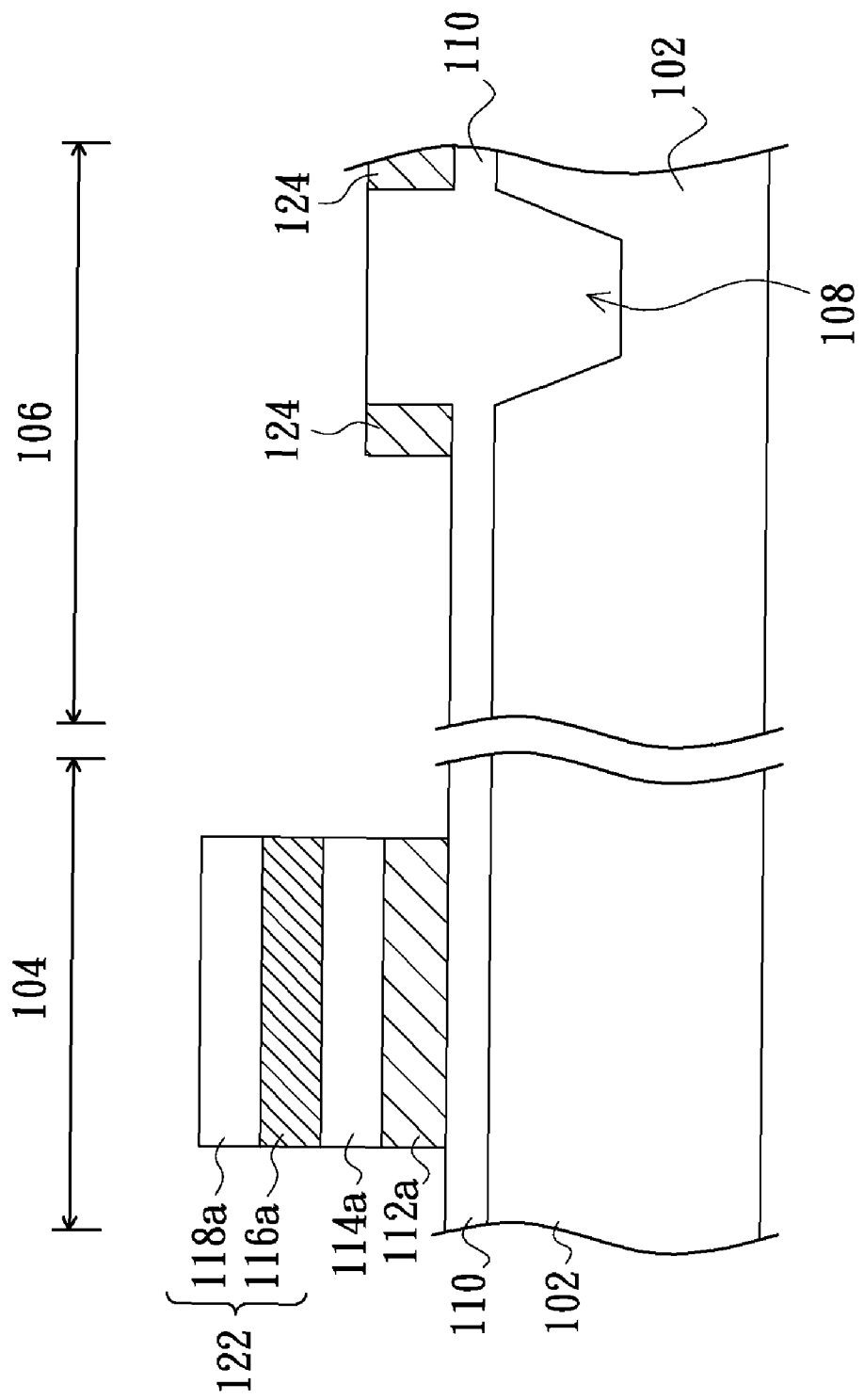

Referring to FIG. 4, a photo-resist lift-off process can be performed so as to remove the patterned photo-resist 120 disposed on the complex hard mask 122. For example, an ashing process can be performed to remove the patterned photo-resist 120 and the remainder complex hard mask 122 underlying the patterned photo-resist 120, and thereby the oxide hard mask 118a is exposed.

Figure 5:
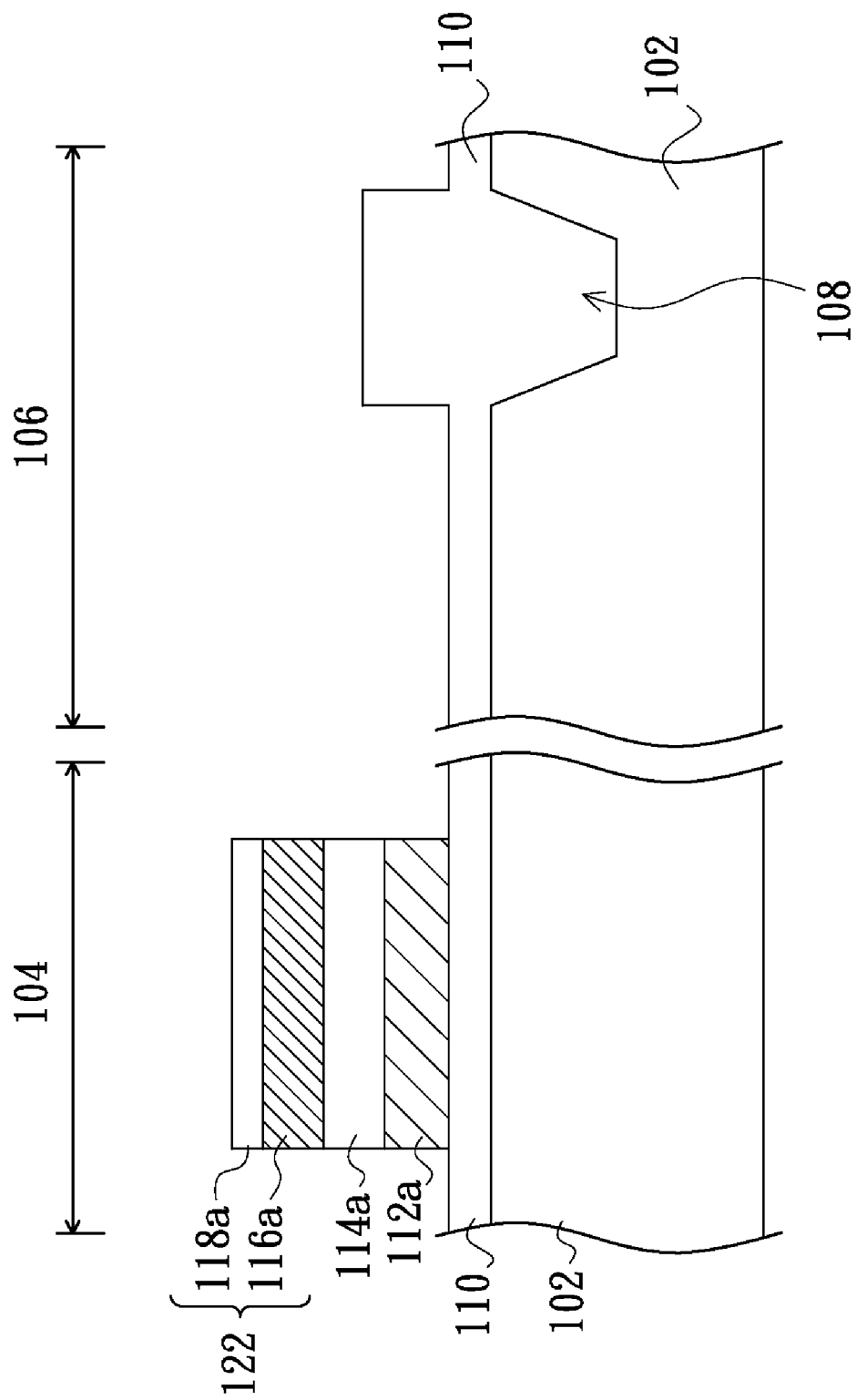

Referring to FIG. 5, another etching process may be performed on the nitride layer 112a by, for example, immersing the nitride layer 112a into a hot phosphoric acid solution, to remove the redundant fence 124. In other words, in the present embodiment, the phosphoric acid solution may be used to remove the portion of the nitride layer 112 covering the sidewalls of the isolation structure 108. Since the hot phosphoric acid solution has a greater etching selectivity for nitride and oxide, the oxide hard mask layer 118a of the complex hard mask 122 has better anti-corrosion effect to the phosphoric acid solution. Therefore, even if the phosphoric acid solution may reduce the thickness of the oxide hard mask 118a, the oxide hard mask 118a can still protect the nitride hard mask 116a, the top oxide layer 114a and the nitride layer 112a underlying the oxide hard mask 118a from being damaged or peeled off by the phosphoric acid solution.

According to the study conducted by the present inventors, the hot phosphoric acid solution may reduce the thickness of the top oxide layer 114a to about 30 angstroms or even less, however it almost would not cause any thickness loss to the nitride layer 112a and may reduce the thickness loss to the bottom oxide layer 110a to only about 5 angstroms or even less. Since the top oxide layer 114a is formed with sufficient thickness such that the hot phosphoric acid solution would not damage subsequent ONO structure.

Figure 6:
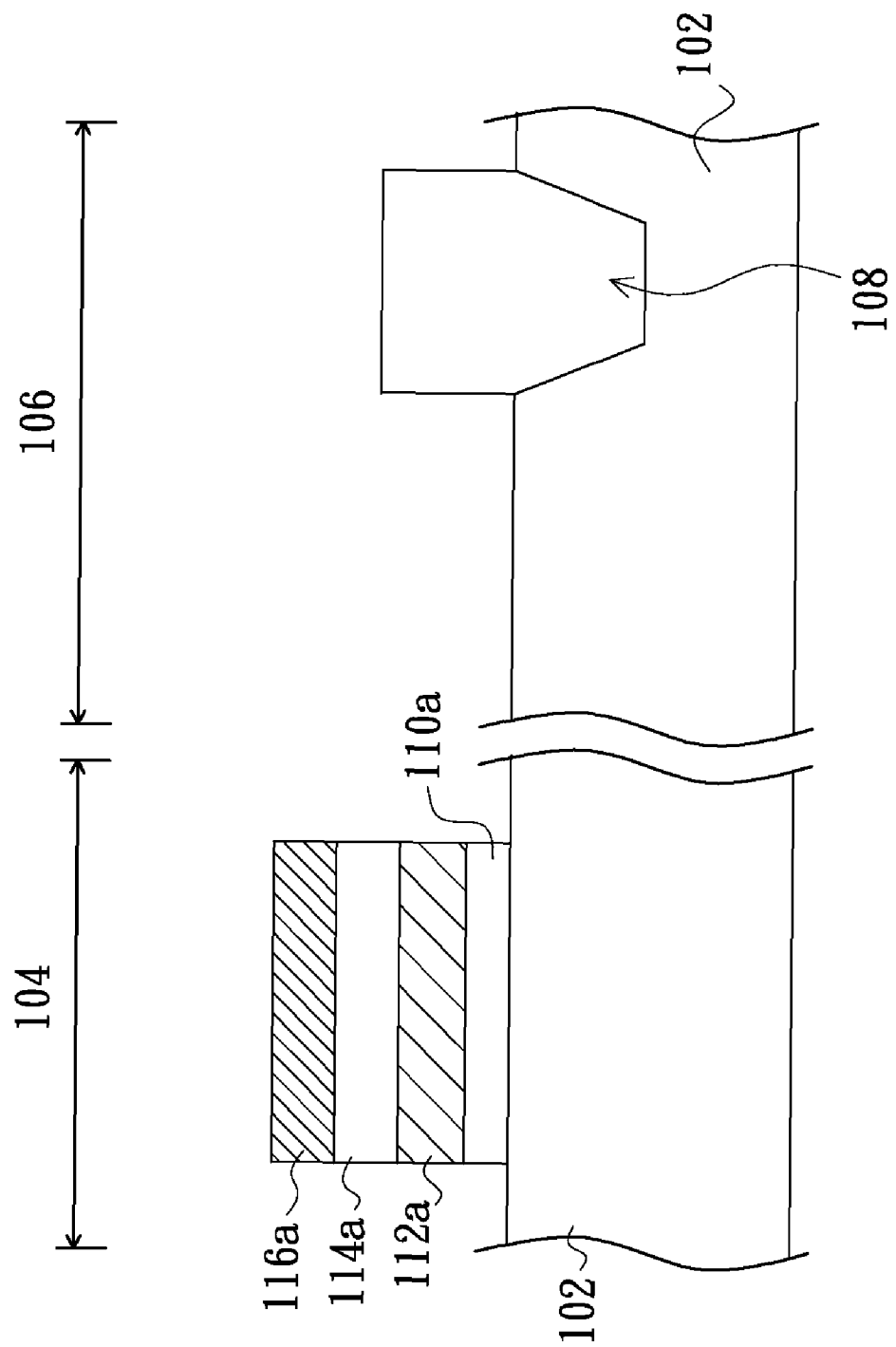

Referring to FIG. 6, the nitride hard mask 116a is used to serve as an etching mask for performing a buffered oxide etching (BOE) process to remove the oxide hard mask 118a and exposed bottom oxide layer 110, and form a patterned bottom oxide layer 110a. The patterned top oxide layer 114a, the nitride layer 112a and the patterned bottom oxide layer 110a constitutes an ONO structure.

Herein, the etching process may be performed by using a buffered oxide etchant. For example, the buffered oxide etchant may include a hydrofluoric acid solution and an ammonium fluoride solution, so as to provide a favorable etching selectivity. Since the phosphoric acid solution is first used to remove the redundant fence 124, the formation of the fence 124 may be avoided and the etching of bottom oxide layer 110 in the BOE process may be effectively prevented. In other words, the fence 124 would not influence the etching pattern of the bottom oxide layer 110a, and thus the layout of the bottom oxide layer 110a may be effectively controlled, and thereby facilitating a region of the substrate 102 that need to be implanted to be exposed for facilitating the subsequent implantation process. As a result, an actual area of the active region 104 would not be decreased and a width of the active device would also be not reduced.

In addition, since the step of removing the redundant fence 124 uses the oxide hard mask 118a to protect the nitride hard mask 116a, the nitride hard mask 116a still has sufficient thickness to protect the top oxide layer 114a and the nitride layer 112a in the BOE process, the undercut effect can be effectively controlled and therefore the damage to the top oxide layer 114a may be effectively reduced.

In another aspect, since the phosphoric acid solution reduces the thickness of the oxide hard mask 118a, a processing time of the BOE process can be adjusted according to factors such as a processing time of the phosphoric acid solution, the thickness of the oxide hard mask 118a and the bottom oxide layer 110a. For example, when the thickness of the oxide hard mask 118a is fixed, if the processing time of the phosphoric acid solution increases, the processing time of the BOE process ought to be shorten.

Figure 7:
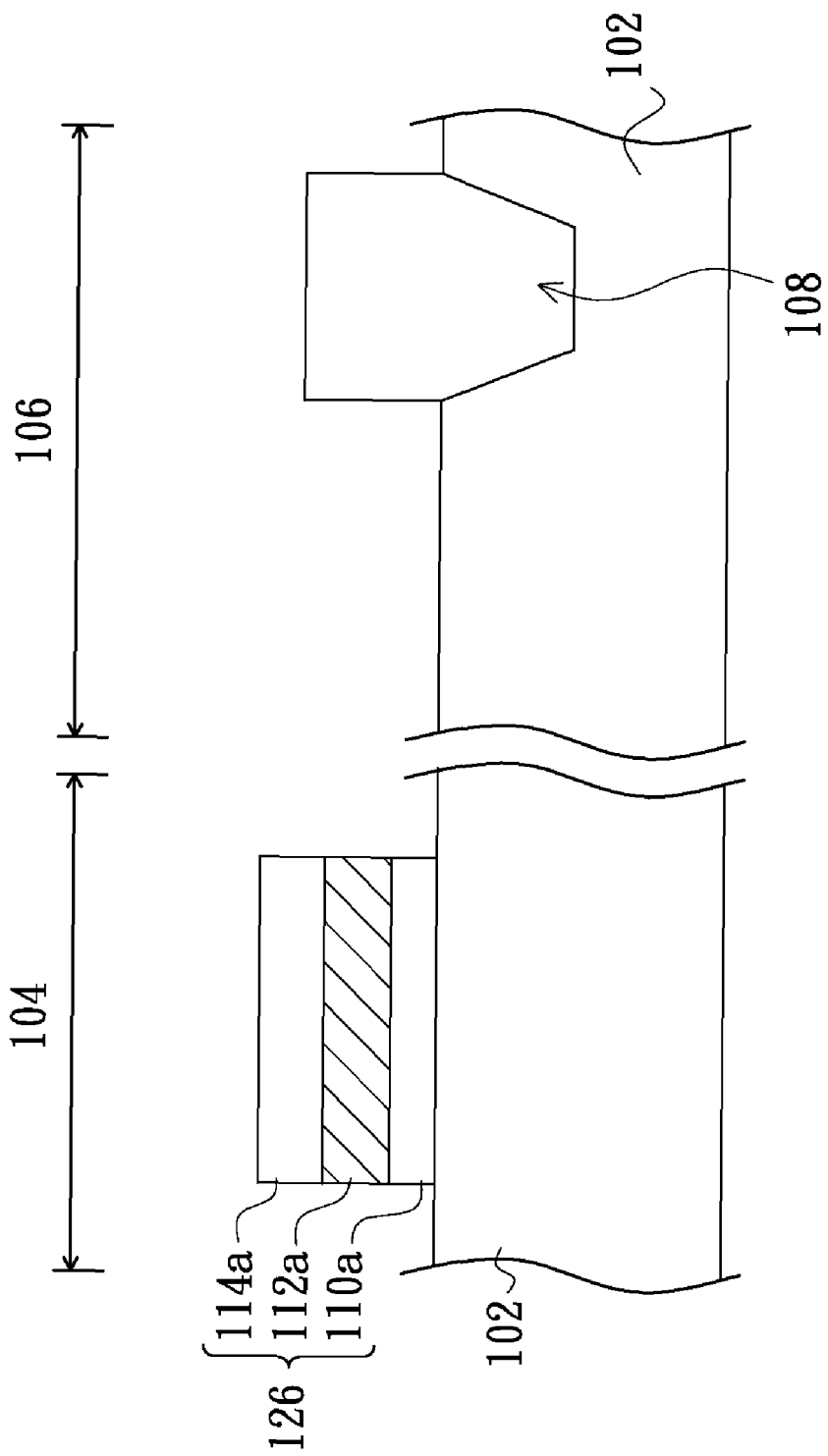

Referring to FIG. 7, a sulfuric-peroxide mixture (SPM) solution may be used to remove the nitride hard mask 116a and expose the patterned top oxide layer 114a, the nitride layer 112a and the bottom oxide layer 110a, and thereby complete the fabrication of the ONO structure 126.

According to the study conducted by the present inventors, nitride is easily prone to reside at the sidewalls of the insulating structure and whereby the redundant fence is formed, causing reduction in the effective area of the active region. Since the present invention uses the complex hard mask including nitride layer and oxide layer and can achieve the advantages of (1) reducing the undercut effect of the top oxide layer by using the better adhesion property of the nitride hard mask and the top oxide layer; (2) since the hot phosphoric acid solution has favorable etching selectivity to nitride and oxide, the redundant fence can be removed by using the hot phosphoric acid solution to avoid the redundant fence to protect the bottom oxide layer in the BOE process, avoid the actual area of the active region to be reduced as well as avoid the width of active device to be reduced; (3) since the nitride hard mask still has enough thickness to protect the top oxide layer and the nitride layer in the BOE process, the top oxide layer would not be easily damaged.

In summary, the present invention can effectively control the layout area and width of active device and improve the performance of the active device. Moreover, the method proposed by the present invention may be easily integrated into general patterning process, no additional lithography process or photo-mask process is needed, it is considerably beneficial for the practical applications of the method.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A method of etching an oxide layer and a nitride layer, comprising:
   providing a substrate having an insulating structure;
   forming a first oxide layer covering the insulating structure on the substrate;
   forming a nitride layer over the first oxide layer;
   forming a second oxide layer over the nitride layer;
   forming a complex hard mask over the second oxide layer; and
   performing a first etching step by using a patterned photo-resist as an etching mask to etch portions of the complex hard mask, the second oxide layer and the nitride layer until exposing the first oxide layer.

2. The method as claimed in claim 1, wherein the insulating structure is a shallow trench isolation structure or a field oxide layer.

3. The method as claimed in claim 1, wherein a portion of the nitride layer remains around the insulating structure after the first etching step.

4. The method as claimed in claim 3, further comprising:
   performing a second etching step to remove the portion of the nitride layer adjacent the insulating structure.

5. The method as claimed in claim 4, wherein the second etching step is performed by using a phosphoric acid solution.

6. The method as claimed in claim 1, wherein the complex hard mask comprises:
   a nitride mask layer over the second oxide layer; and
   an oxide mask layer over the nitride mask layer.

7. The method as claimed in claim 1, wherein the patterned photo-resist comprises a deep ultraviolet photo-resist material.

8. The method as claimed in claim 4, further comprising a step of removing the patterned photo-resist after the first etching step and before the first etching step.

9. The method as claimed in claim 1, wherein the first etching step comprises an anisotropic etching process.

10. The method as claimed in claim 1, wherein a thickness of the second oxide layer is larger than or equal to 50 angstroms.

11. The method as claimed in claim 1, wherein the substrate has an active region and an isolating region defined thereon, the insulating structure is disposed in the isolating region, and the complex hard mask is disposed in the active region.

12. The method as claimed in claim 10, wherein the step of forming the first oxide layer comprises performing a thermal oxidation process.

13. The method as claimed in claim 4, after the second etching step, further comprising:
   performing a third etching step to remove the oxide mask layer and the first oxide layer exposed.

14. The method as claimed in claim 13, after the third etching step, further comprising:
   removing the nitride mask layer to form an oxide-nitride-oxide structure.

15. The method as claimed in claim 14, wherein the step of removing the nitride mask layer comprises using a sulfuric-peroxide mixture solution.

* * * * *